(12) United States Patent
Ito et al.

(10) Patent No.: US 7,413,930 B2
(45) Date of Patent: Aug. 19, 2008

(54) LEAD FRAME AND METHOD OF MANUFACTURING THE LEAD FRAME

(75) Inventors: Fujio Ito, Hanno (JP); Hiromichi Suzuki, Machida (JP); Toshio Sasaki, Mizuho (JP)

(73) Assignee: Renesas Technology Corp., Tokyo (JP)

( * ) Notice: Subject to any disclaimer, the term of this patent is extended or adjusted under 35 U.S.C. 154(b) by 88 days.

(21) Appl. No.: 10/569,577

(22) PCT Filed: Aug. 29, 2003

(86) PCT No.: PCT/JP03/11120

§ 371 (c)(1),
(2), (4) Date: Feb. 28, 2006

(87) PCT Pub. No.: WO2005/024944

PCT Pub. Date: Mar. 17, 2005

(65) Prior Publication Data

US 2007/0001271 A1    Jan. 4, 2007

(51) Int. Cl.
*H01L 21/82* (2006.01)
(52) U.S. Cl. ..................................... 438/111
(58) Field of Classification Search ................ 438/111, 438/123; 257/666
See application file for complete search history.

(56) References Cited

U.S. PATENT DOCUMENTS 5,936,303 A    8/1999    Nishi

FOREIGN PATENT DOCUMENTS

| JP | 5-291454  | 11/1993 |
| JP | 5-315531  | 11/1993 |
| JP | 7-245365  | 9/1995  |
| JP | 8-204100  | 8/1996  |
| JP | 10-22432  | 1/1998  |
| JP | 11-31778  | 2/1999  |

*Primary Examiner*—M. Wilczewski
*Assistant Examiner*—Swapneel Chhaya
(74) *Attorney, Agent, or Firm*—Antonelli, Terry, Stout & Kraus, LLP.

(57) ABSTRACT

A plurality of inner leads, a plurality of outer leads formed in one with each of the inner lead, a bar lead of the square ring shape arranged inside a plurality of inner leads, a corner part lead which has been arranged between the inner leads of the end portion of the inner lead groups which adjoin among four inner lead groups corresponding to each side of the bar lead, and was connected with the bar lead, and a tape member joined to the tip part of each inner lead, a bar lead, and a corner part lead are included. Since the corner part lead is formed as an object for reinforcement of a frame body between adjoining inner lead groups, the rigidity of the lead frame can be increased.

2 Claims, 14 Drawing Sheets

LEAD FRAME AND METHOD OF MANUFACTURING THE LEAD FRAME

INCORPORATION BY REFERENCE

The present application claims priority from PCT application PCT/JP03/011120 filed on Aug. 29, 2003, the content of which is hereby incorporated by reference into this application.

TECHNICAL FIELD

The present invention relates to a manufacturing method of a lead frame with a bar lead, and particularly relates to a manufacturing method of a lead frame with the bar lead of ring shape.

BACKGROUND ART

In a lead frame with the bar lead (it is also called a bus bar) which is a common lead used for stabilization of a power source/GND etc., when arranging the bar lead of ring shape, it is arranged in the region surrounded by the inner lead tip group of each side. In that case, each inner lead tip is stuck on the sheet member via the insulation member, further, a chip mounting region is formed in the about central part of the sheet member, and the bar lead of ring shape is arranged in the region between the chip mounting region and the tip group of inner leads.

If it is going to form a plurality of bar leads of ring shape for reinforcement of a power source/GND, the combination part of each bar lead will increase, therefore a cutting part will also increase. About the various lead frames in which a plurality of bar leads of ring shape were formed, PCT/JP03/06151 have the description.

When a bar lead increases, since not only connection of a bar lead but a lead pattern becomes complicated, rigidity must be increased also as the whole lead frame and reinforcement of a lead frame is needed. In order to maintain the strength of a frame, a connection part must be increased, and as a result cutting parts will also increase in number and consideration is needed also about how at the time of cutting to put in a punch, or abrasion of a punch.

Although Japanese Unexamined Patent Publication No. Hei 9-252072 has the description about the lead frame of the structure where the tips of a plurality of leads are connected, the analyses about the reinforcement of a lead at the time of increasing a bar lead or the punch at the time of cutting are not made.

The purpose of the present invention is to offer a manufacturing method of a lead frame which increases rigidity.

The other purpose of the present invention is to offer a manufacturing method of a lead frame which aims at elongation of lifetime of the punch for cutting.

The above-described and the other purposes and novel features of the present invention will become apparent from the description herein and accompanying drawings.

DISCLOSURE OF THE INVENTION

The present invention comprises the steps of preparing a frame body in which tip parts of inner leads are mutually formed in one by a first connection part; preparing a tape member of a shape corresponding to a plurality of inner lead rows; sticking a tip part of each of the inner leads and the first connection part, and the tape member; and after the sticking, removing the first connection part from the frame body by punching and cutting the first connection part from a surface at a side of chip mounting using a punch along tip parts of the inner leads; wherein after the removing, coining of a joined part of the inner lead and the tape member is performed.

BEST MODE FOR CARRYING OUT THE INVENTION

Figure 1:
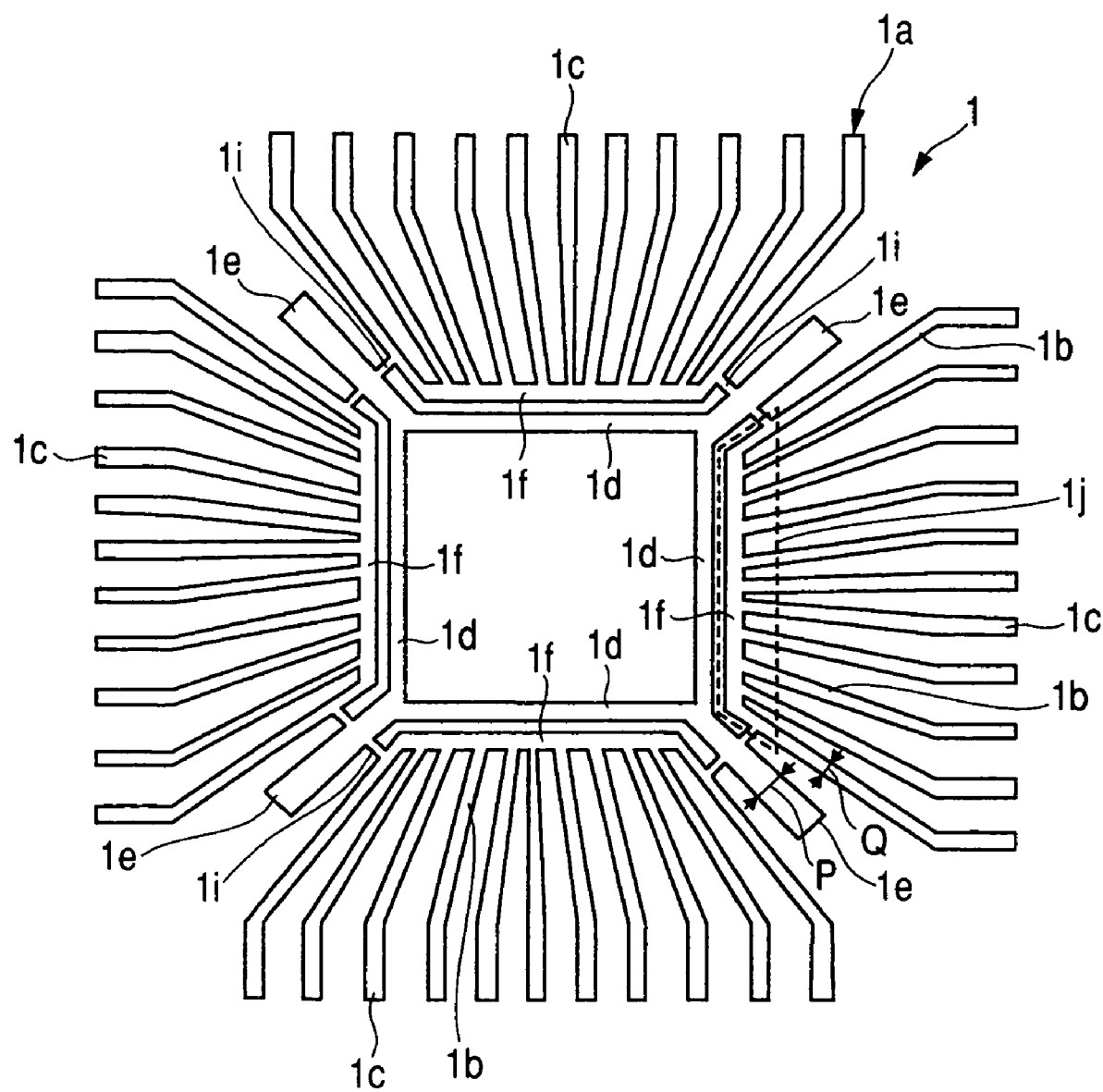
FIG. 1 is a plan view showing an example of the structure of the frame body used for the assembly of the lead frame of Embodiment 1 of the present invention.

Hereafter, embodiments of the invention are explained in detail based on drawings.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number is not limited to a specific number but can be greater than or less than the specific number unless otherwise specifically indicated or principally apparent that the number is limited to the specific number.

Moreover, in the below-described embodiments, it is needless to say that the constituting elements (including element steps) are not always essential unless otherwise specifically indicated or principally apparent that they are essential.

Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range.

In all the drawings for describing the embodiments, members of a like function will be identified by like reference numerals and overlapping descriptions will be omitted.

Embodiment 1

Figure 6:
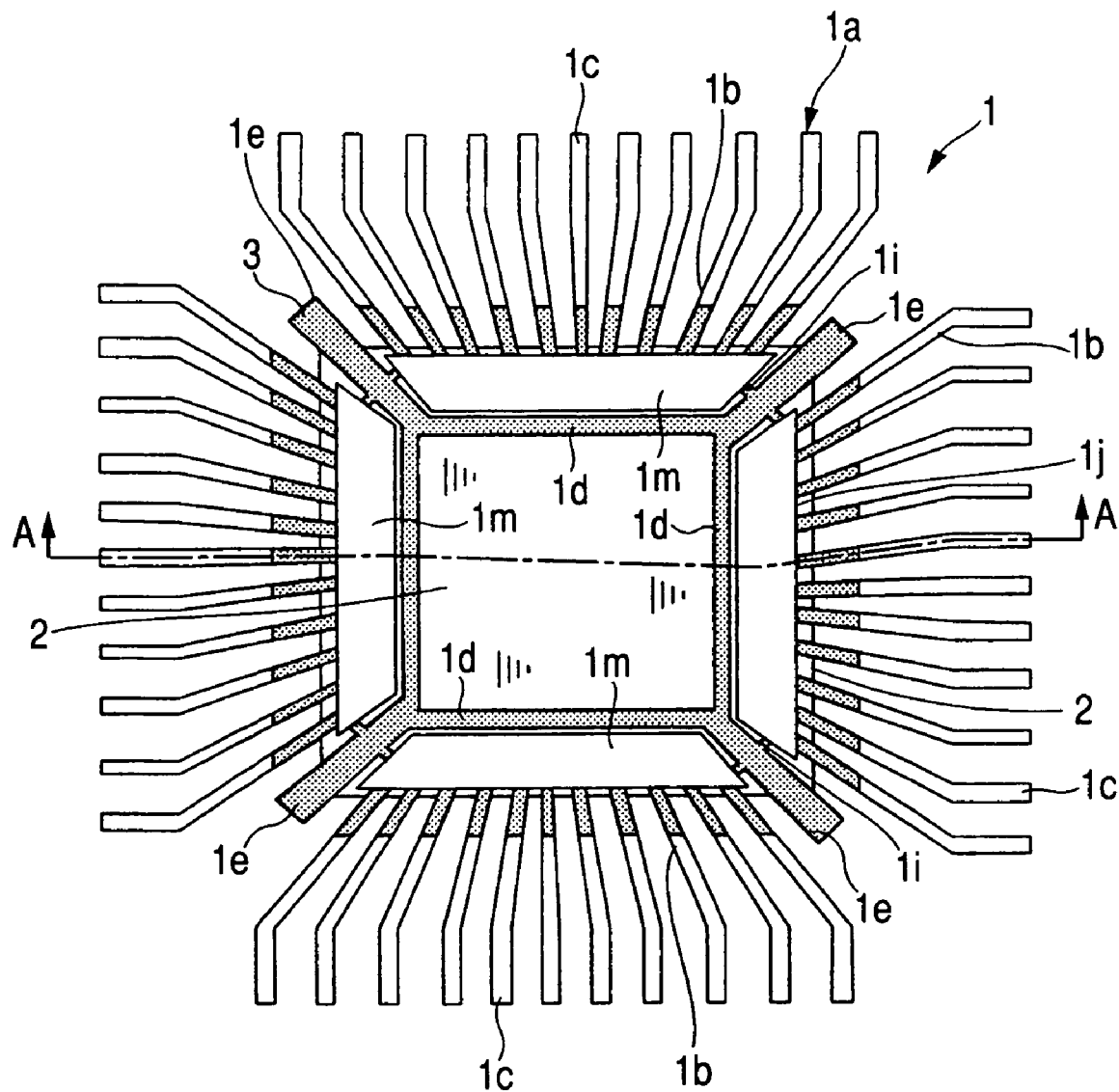
FIG. 6 is a plan view showing an example of the structure after the punch in the assembly shown in FIG. 3.
Figure 7:
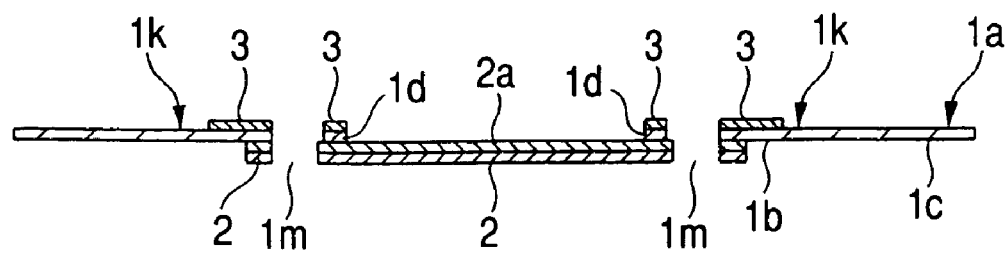
FIG. 7 is a sectional view showing an example of the structure cut along with the A-A line shown in FIG. 6, FIG. 8-FIG. 11 are the plan views showing the structure of the frame body of the modification of Embodiment 1 of the present invention, respectively.

A lead frame 1 of Embodiment 1 is used for assemblies of such as QFP (Quad Flat Package) which is a semiconductor device with comparatively many pins, and as shown in FIG. 6 and FIG. 7, it has laminated frame body 1a which are a plurality of conductor leads and which includes inner lead 1b or outer lead 1c, and tape member 2 which is an insulating sheet member.

In lead frame 1, only one device region corresponding to one semiconductor device is shown in FIG. 6, and a plurality of device regions shown in FIG. 6 are formed in many rows or one row continuing in a row in lead frame 1.

The fine structure of lead frame 1 is explained. A plurality of inner leads 1b, a plurality of outer leads 1c formed in one with each of a plurality of inner leads 1b, bar lead 1d of the square ring shape arranged inside a plurality of inner leads 1b, corner part lead 1e which is arranged between adjoining inner leads 1b of an end portion of each group in the inner lead groups which adjoin among four inner lead groups corresponding to each side of bar lead 1d of square ring shape, and was connected with bar lead 1d, and tape member (insulating sheet member) 2 joined to the tip part of each inner lead 1b, bar lead 1d, and corner part lead 1e are included.

Tape member 2 is joined to frame body 1a via insulating adhesive layer 2a, as shown in FIG. 7.

That is, tape member 2 has the shape corresponding to an inner lead 1b row, and it has insulation while it is the quadrangle. It has joined to the tip part of each inner lead 1b via adhesive layer 2a formed in this tape member 2. Adhesive layer 2a is formed from the adhesives of the acrylic system etc., for example.

Tape member 2 has a chip mounting function, and serves as a chip mounting part on which a semiconductor chip is mounted in the assembly of a semiconductor device.

In lead frame 1, through holes 1m formed by lead trimming are formed at the outside of each bar lead 1d of square ring shape. This through hole 1m adjoins the tip part of each inner lead 1b, and is formed along the column direction of inner lead 1b. Therefore, corresponding to each side of quadrangular tape member 2, four through holes 1m are formed.

In lead frame 1 of Embodiment 1, corner part lead 1e is formed between inner leads 1b of the end portion of adjoining inner lead 1b groups (i.e., in the corner part between adjoining inner lead groups) as an object for reinforcement of frame body 1a.

Figure 5:
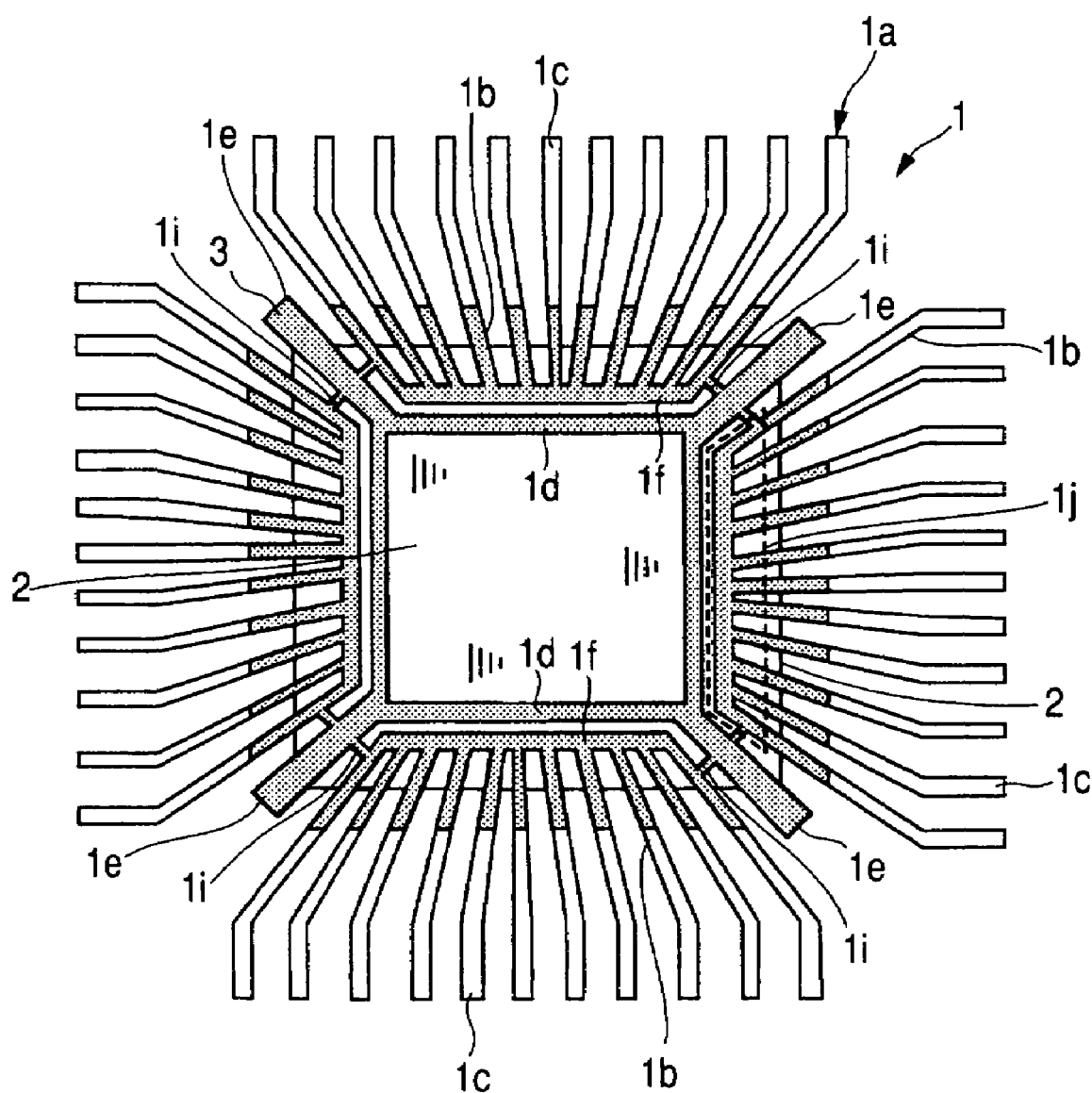
FIG. 5 is a plan view showing an example of the structure after the tape member attachment in the assembly shown in FIG. 3.

Namely, since strength is weak only by tape member 2 in the region of tape member 2 between cutting area 1j which is a region where the tip of an inner lead group is punched and which is shown in FIG. 5, and cutting area 1j which adjoins this, corner part lead 1e is formed as the reinforcement, and this is raising the rigidity of lead frame 1.

In that case, as shown in FIG. 1, as for the width (P) of corner part lead 1e, it is preferred to form more widely than the width (Q) of the tip part of inner lead 1b (P>Q), and it can increase the rigidity of lead frame 1 further by this.

While having connected corner part lead 1e with the corner part of bar lead 1d of ring shape, corner part connection part 1i connects corner part lead 1e with inner lead 1b arranged at the end portion of each inner lead group, the rigidity of frame body 1a is increased by this, and the rigidity of lead frame 1 is also increased.

As for lead frame 1 of Embodiment 1, the tip part of each inner lead 1b is not beforehand individually separated at the time of patterning of inner lead 1b, patterning connected by first connection parts 1f as that the tip part of each inner lead 1b might not separate in each inner lead group is performed, and after sticking tape member 2 on frame body 1a, cutting isolation of the first connection parts 1f is performed to the whole tape member 2, and the tip part of each inner lead 1b is individually separated.

FIG. 1 shows the shape of only frame body 1a before the tape member attachment in manufacture of lead frame 1, and the tip parts of each inner lead 1b are connected by first connection parts 1f in each inner lead group. Furthermore, inner lead 1b of the end portion in each inner lead group and corner part lead 1e are connected by corner part connection part 1i.

Therefore, at the time of the lead individual separation after tape member attachment, while punching first connection parts 1f using punch 5 (refer to FIG. 12) for cutting corresponding to the shape of cutting area 1j of FIG. 1, corner part connection part 1i is cut, and lead individual separation is performed.

Figure 2:
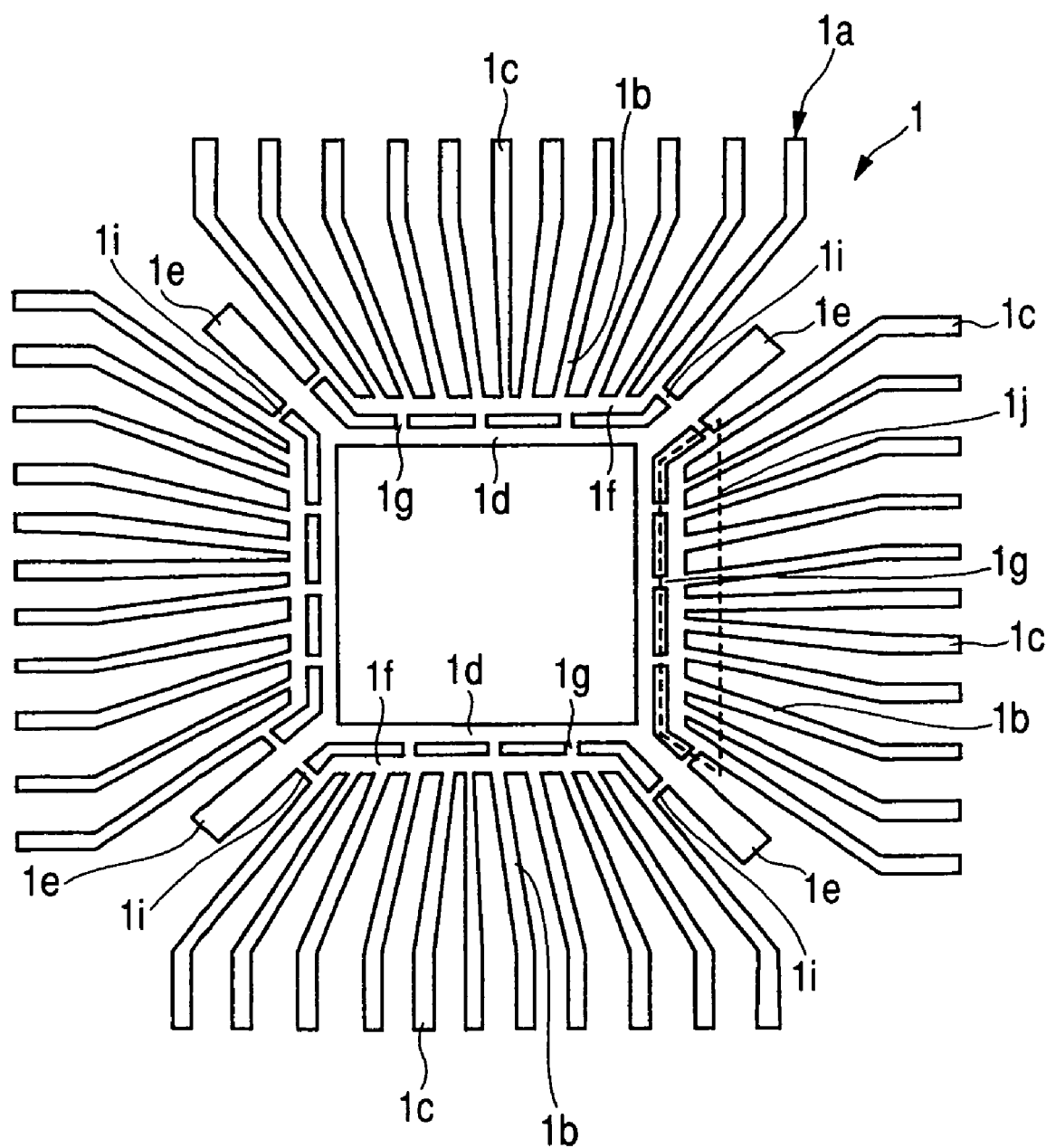
FIG. 2 is a plan view showing the structure of the frame body of a modification.

FIG. 2 shows the shape of frame body 1a of a modification, and it has second connection parts 1g that connect first connection parts 1f, and bar lead 1d in addition to the frame shape of FIG. 1. That is, first connection parts 1f of each inner lead group and bar lead 1d corresponding to this are connected by second connection parts 1g, and this can raise further the rigidity of frame body 1a and lead frame 1.

At the time of the lead individual separation after tape member attachment of frame body 1a shown in FIG. 2, by punching first connection parts if along the tip parts of inner lead 1b, and simultaneously cutting corner part connection part 1i and second connection parts 1g, using punch 5 for cutting corresponding to the shape of cutting area 1j of FIG. 2, first connection parts 1f are made to separate from frame body 1a, and lead individual separation is performed.

Next, the manufacturing method of lead frame 1 of Embodiment 1 shown in FIG. 6 and FIG. 7 is explained.

Figure 3:
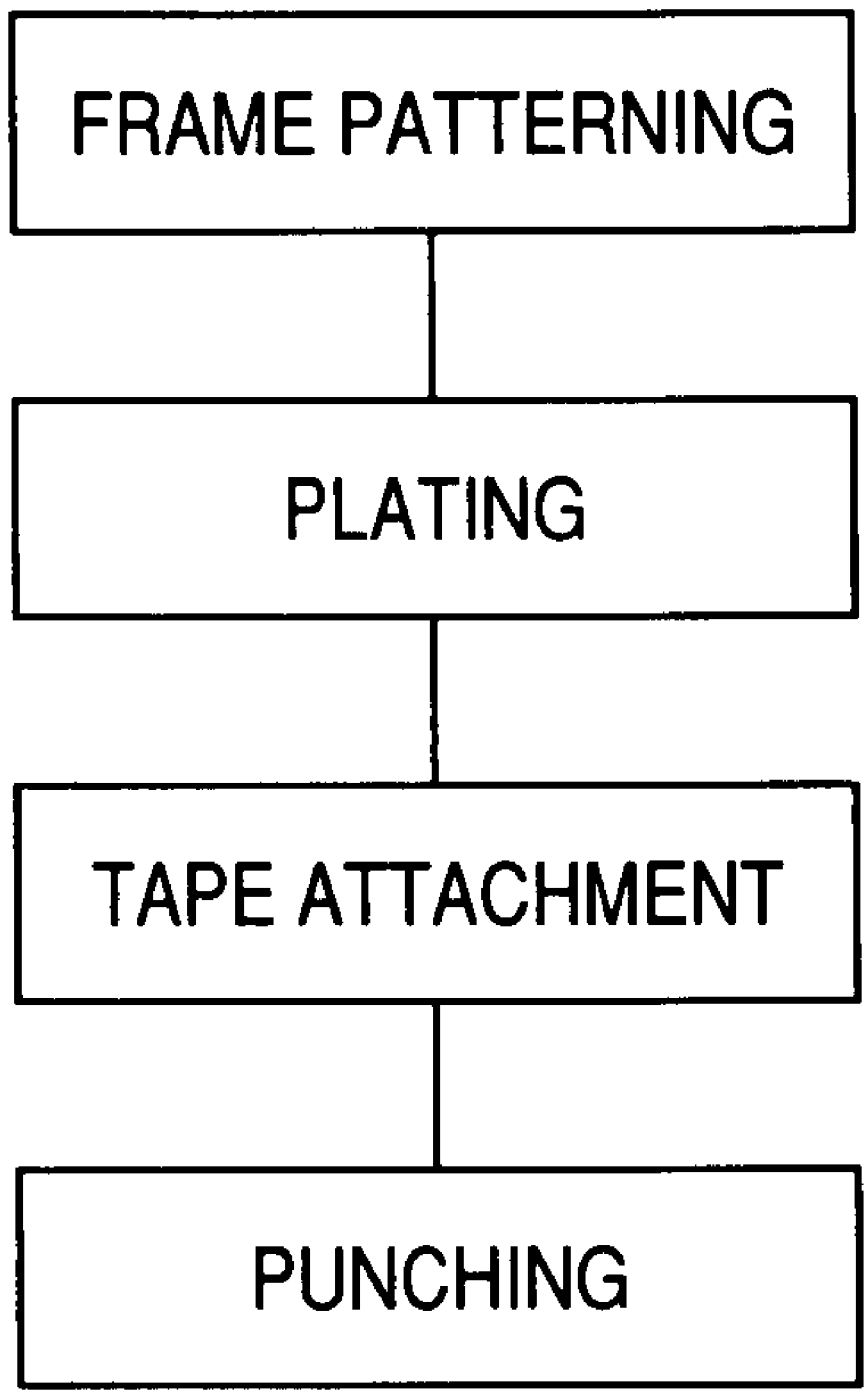
FIG. 3 is an assembly flow diagram showing an example of the assembly procedure of the lead frame of Embodiment 1 of the present invention.

First, frame body 1a as shown in FIG. 1 is formed by patterning shown in FIG. 3.

This frame body 1a is a laminated metal member, and has a plurality of inner leads 1b arranged corresponding to the electrode row of the semiconductor chip mounted, a plurality of outer leads 1c formed in one with this, first connection parts if that connect the tip parts of a plurality of inner leads 1b mutually at one, bar lead 1d of the square ring shape arranged inside first connection parts 1f, corner part lead 1e connected with this bar lead 1d at the corner part of a bar lead 1d of the square ring shape, and corner part connection part 1i which connects inner lead 1b of the end portion of each inner lead group, and corner part lead 1e.

Frame body 1a is formed with the copper plate etc., and is patterned by press working or etching processing, for example.

On the other hand, tape member 2 which is an insulating sheet member of the quadrangle corresponding to a plurality of inner lead rows is prepared. Adhesive layers 2a, such as thermoplasticity, are formed in surface of at least one of the two at tape member 2.

Then, plating shown in FIG. 3 is performed.

Figure 4:
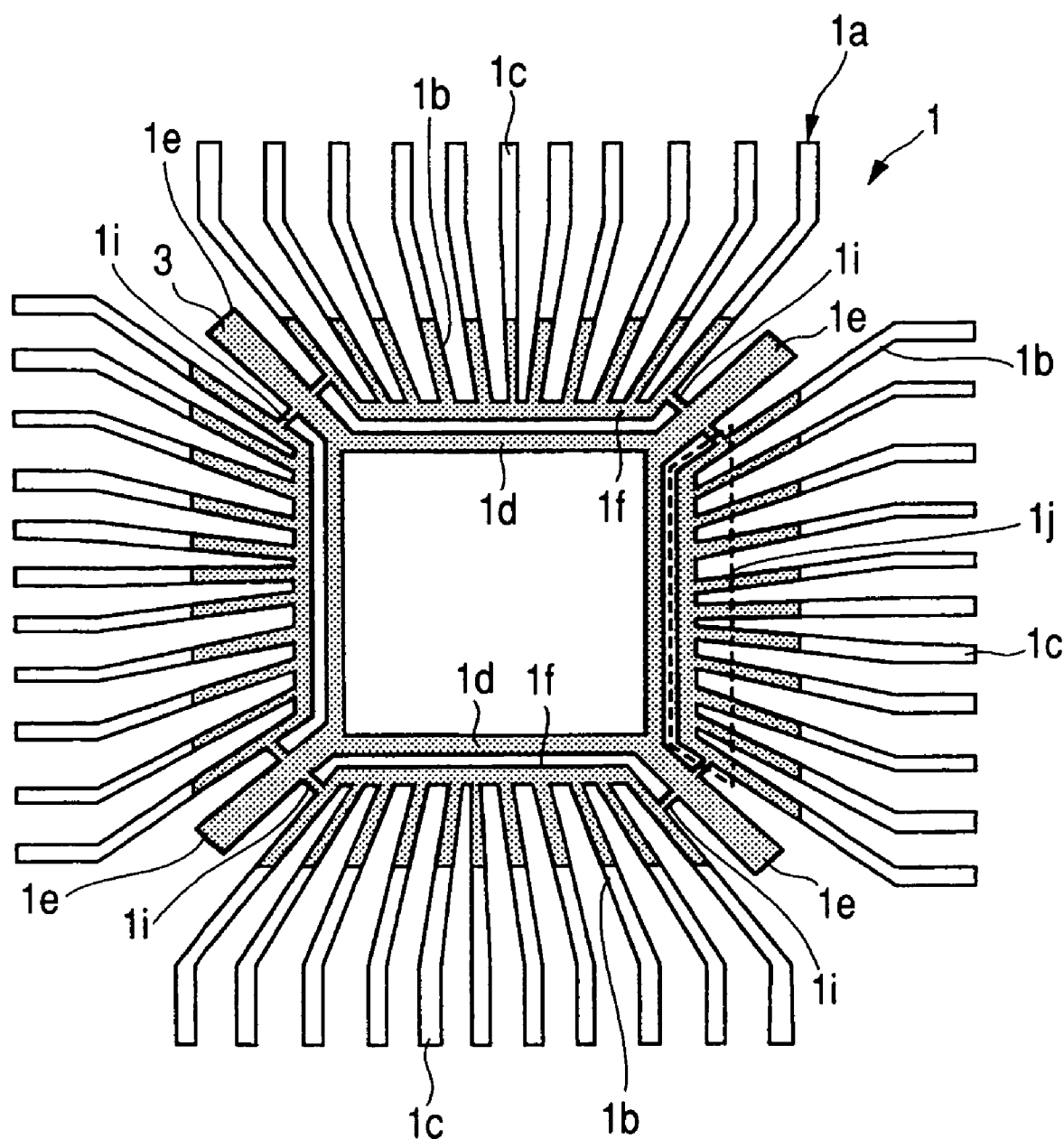
FIG. 4 is a plan view showing an example of the structure after the plating formation in the assembly shown in FIG. 3.

Here, in wire connection surface (surface at the side of chip mounting) 1k shown in FIG. 7 of each inner lead 1b, as shown in FIG. 4, the region from each tip part to the part where connection with a wire is made is plated, and it plates further also to bar lead 1d of ring shape, and corner part lead 1e. The plating is silver plating 3 for wire connection, for example.

As a substitute of silver plating 3, palladium plating may be performed or palladium plating may be performed all over frame body 1a.

Then, tape attachment shown in FIG. 3 is performed.

Here, at the surface which is the opposite side to wire connection surface 1k of a plurality of inner lead 1b shown in FIG. 7, as shown in FIG. 5, the tip part of a plurality of inner leads 1b, first connection parts if, bar lead 1d of ring shape, corner part lead 1e and corner part connection part 1i, and tape member 2 are stuck.

In that case, tape member 2 is stuck on frame body 1a via, for example, adhesive layer 2a which was beforehand formed in tape member 2 and which is shown in FIG. 7.

Then, punching shown in FIG. 3 is performed.

Here, by cutting corner part connection part 1i while punching first connection parts 1f along the tip part of a plurality of inner leads 1b using punch 5 (refer to FIG. 12) for cutting corresponding to the shape of cutting area 1j shown in FIG. 1, and making first connection parts if separate from frame body 1a the whole tape member 2 by this, as a result, as shown in FIG. 6, through holes 1m are formed.

Thus, in manufacture of lead frame 1 of Embodiment 1, by cutting the tip of each inner lead 1b, after sticking tape member 2 on frame body 1a, the generation of the inconvenience that a lead tip bends, a lead pitch shifts in the manufacturing process of lead frame 1, an adverse effect is given on the wire bonding of the assembly of a semiconductor device, and as a result the yield in a lead frame manufacturing process falls can be prevented.

In lead frame 1 of Embodiment 1, since corner part lead 1e is arranged also in the free area between the adjacent inner lead groups and the strength is raised by forming corner part lead 1e which has been arranged between the inner leads of the end portion of each group in the inner lead group which adjoins among four inner lead groups corresponding to each side of bar lead 1d of square ring shape, and was connected with bar lead 1d, the rigidity of lead frame 1 with bar lead 1d of square ring shape can be increased.

As a result, the generation of the waviness of tape member 2 in the time of lead trimming etc. can be prevented, and improvement in the yield in manufacture of lead frame 1 can be aimed at.

Next, the lead frame of the modification shown in FIG. 8-FIG. 11 is explained.

Frame body 1a shown in FIG. 8-FIG. 11 is a case where corner part lead 1e connected with bar lead 1d of square ring shape is exposed to the outside of a semiconductor device as a terminal united with outer lead 1c.

Figure 8:
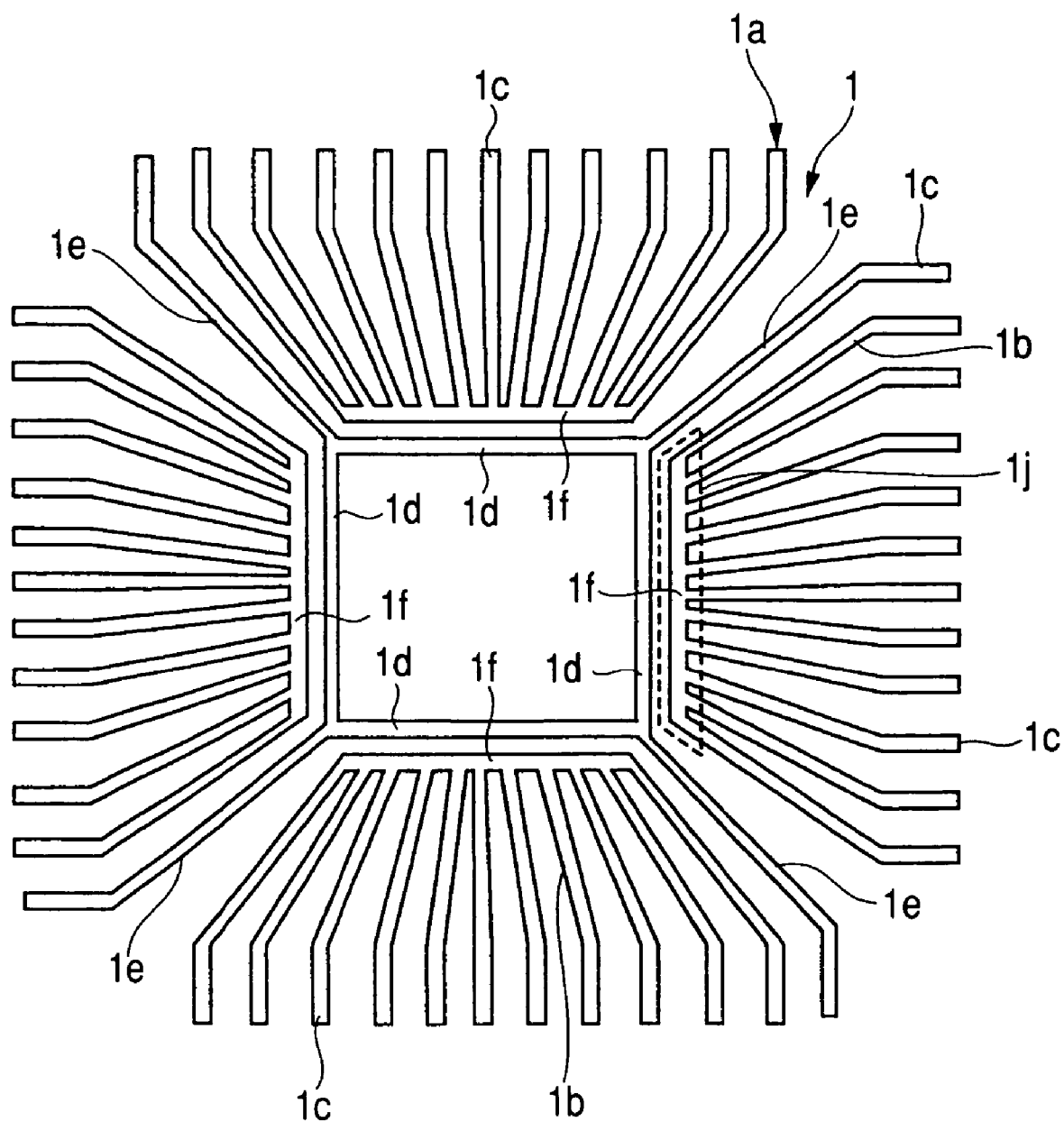

As for frame body 1a shown in FIG. 8, corner part lead 1e is connected with each corner part of bar lead 1d of square ring shape, this bar lead 1d and corner part lead 1e are the things of structure which became independent of each inner lead group, and only first connection parts if that have connected the tip part of each inner lead 1b are punched at the time of the lead individual separation after tape member attachment.

Figure 9:
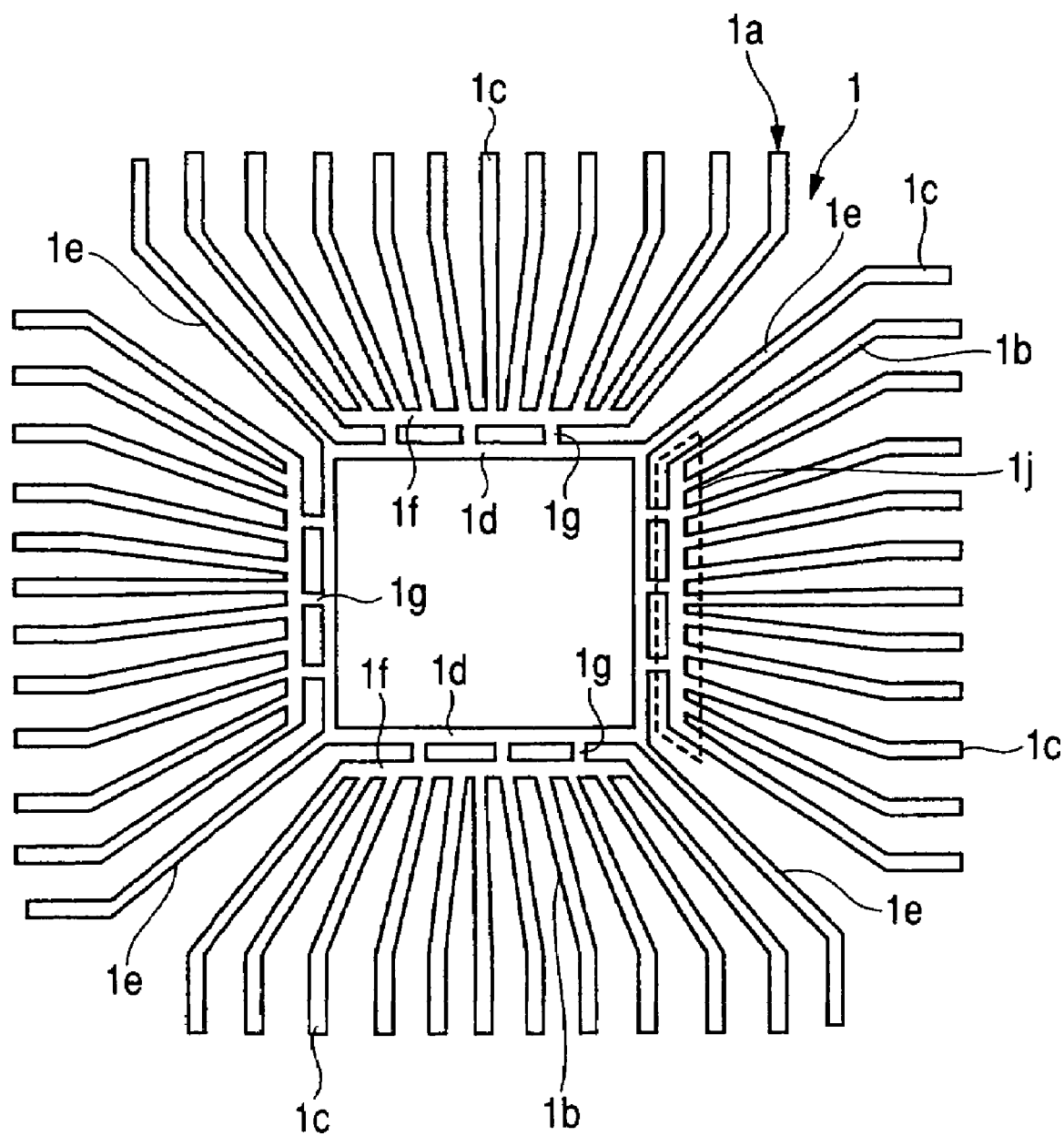

Frame body 1a shown in FIG. 9 is a thing of the structure where first connection parts if are connected with bar lead 1d by second connection parts 1g to frame body 1a shown in FIG. 8. At the time of the lead individual separation after tape member attachment, second connection parts 1g are also cut simultaneously while punching first connection parts 1f that have connected the tip part of each inner lead 1b.

Figure 10:
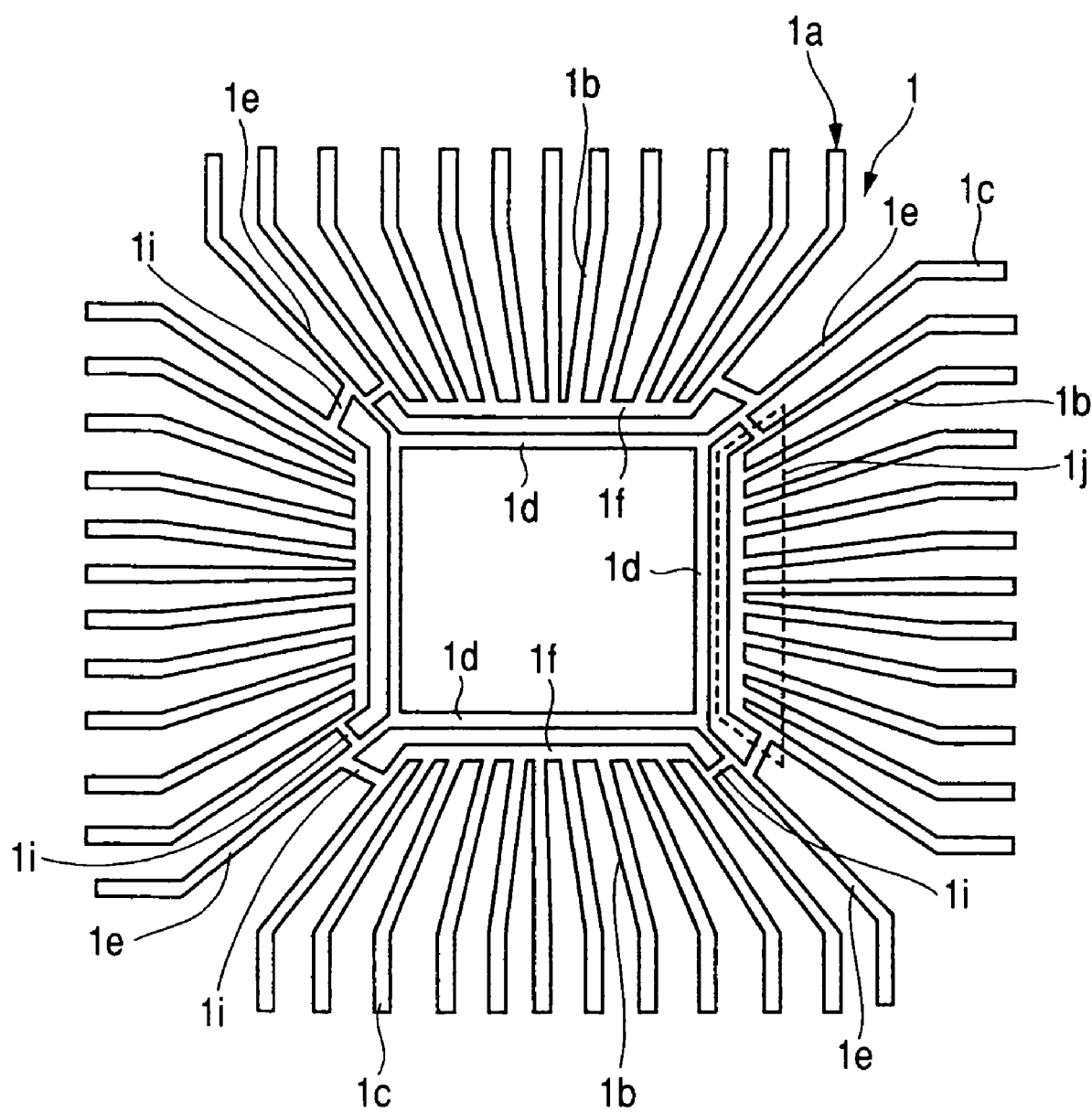

Frame body 1a shown in FIG. 10 is a thing of the structure which connected corner part lead 1e with inner lead 1b of the both sides by corner part connection part 1i to frame body 1a shown in FIG. 8. At the time of the lead individual separation after tape member attachment, corner part connection part 1i are also cut simultaneously while punching first connection parts 1f that have connected the tip part of each inner lead 1b.

Figure 11:
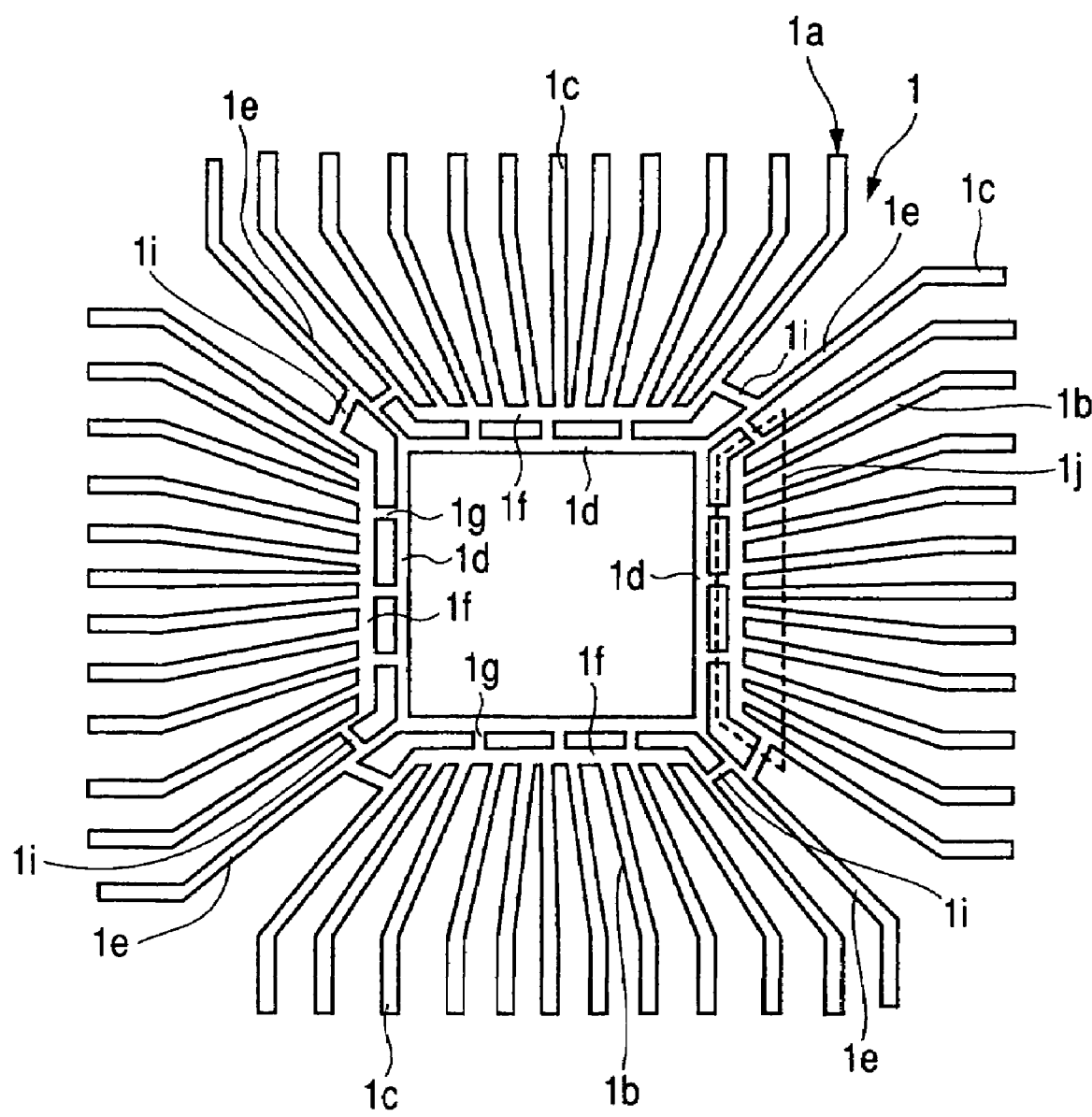

Frame body 1a shown in FIG. 11 is a thing of the structure which connected first connection parts 1f with bar lead 1d by second connection parts 1g further to frame body 1a shown in FIG. 10. At the time of the lead individual separation after tape member attachment, corner part connection part 1i, and second connection parts 1g are also cut simultaneously while punching first connection parts 1f that have connected the tip part of each inner lead 1b.

Figure 12:
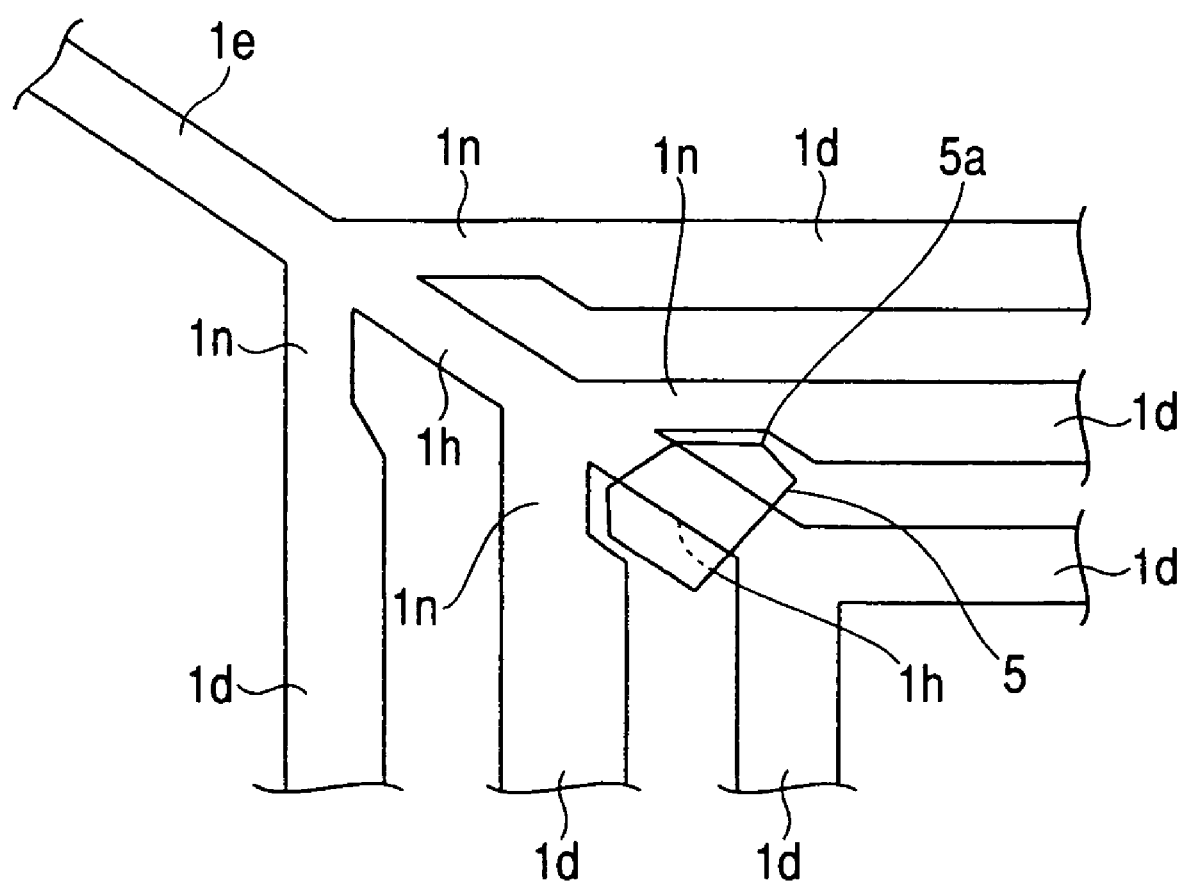
FIG. 12 is an enlarged partial plan view showing the structure of the frame body of the modification of Embodiment 1 of the present invention.

Next, the modification shown in FIG. 12 is a case where bar lead 1d of ring shape is continued and formed in plural lines (for example, three rows), and is the structures where bar lead 1d of the most inner circumference and middle bar lead 1d, further middle bar lead 1d and bar lead 1d of the outermost periphery were connected by third connection parts 1h, respectively.

In this frame body 1a, each has width narrow parts in by which lead width was narrowly formed near the corner part of bar lead 1d of an outermost periphery, and middle bar lead 1d, respectively.

As shown in FIG. 12, this width narrow part in avoids the placing region of punch 5, and forms lead width narrowly so that punch 5 for cutting may be driven into third connection parts 1h at the time of lead trimming, without hitting against bar lead 1d. By this, edge part 5a of punch 5 will pass the side part of the width narrow part in of bar lead 1d at the time of punching, without contacting bar lead 1d.

As a result, abrasion of edge part 5a of punch 5 can be prevented, and elongation of lifetime of punch 5 can be aimed at.

Embodiment 2

Embodiment 2 explains the method of patterning of frame body 1a, and the direction of the back-and-front surface of frame body 1a at the time of joining frame body 1a and sheet member 4 in manufacture of a lead frame.

Figure 13:
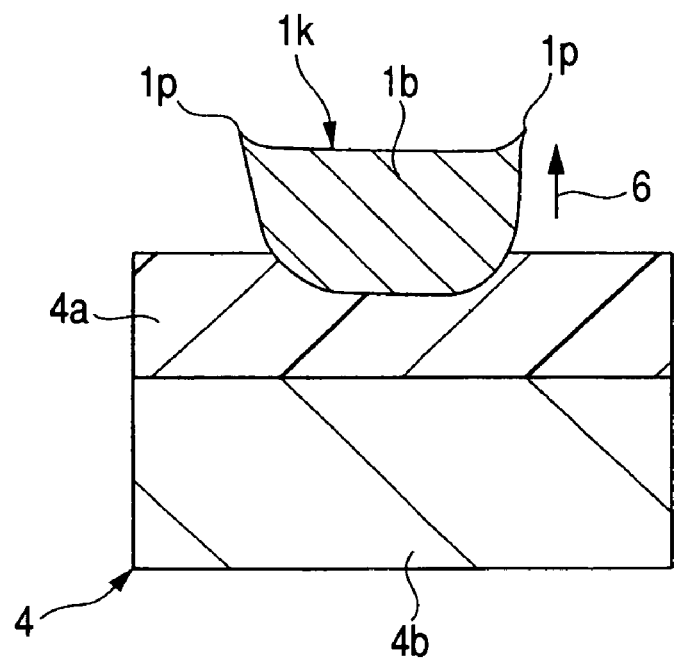
FIG. 13 is a sectional view showing an example of the structure of the cutting plane of the width direction of the inner lead in the lead frame of Embodiment 2 of the present invention.

FIG. 13 shows the jointing condition of inner lead 1b patterned by press working and sheet member 4. In press working, burr portion 1p is formed toward the extracted direction by performing an extraction processing in the extraction direction 6. Sheet member 4 includes insulating adhesive layer 4a and copper plate (metal plate) 4b for heat radiation, and, by making the surface at the side of burr portion 1p formation of inner lead 1b into wire connection surface 1k, has joined the surface of the languishing side of the opposite side, and adhesive layer 4a of sheet member 4.

Since the surface at the side of the burr portion 1p formation by press working has turned to the opposite side of sheet member 4 in the case of the jointing condition shown in FIG. 13, it can prevent that burr portion 1p breaks through adhesive layer 4a, hits copper plate 4b, and causes an electric short circuit.

Figure 14:
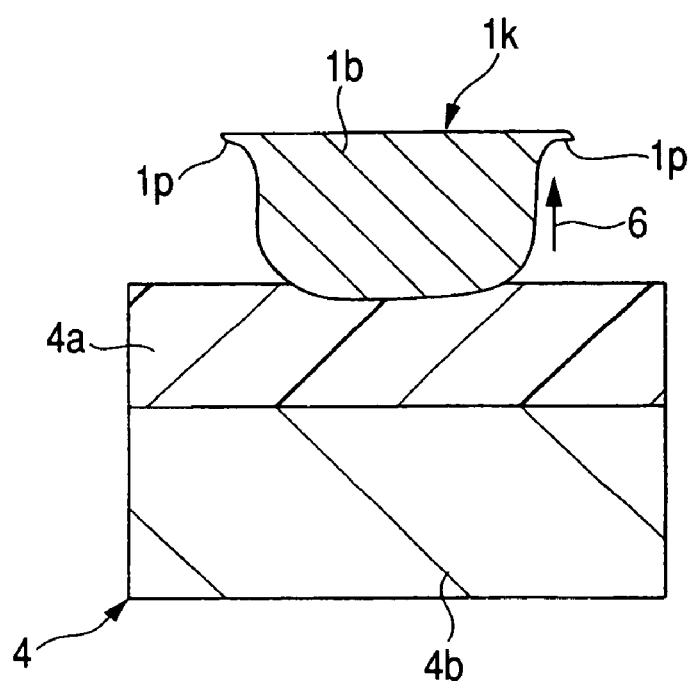
FIG. 14-FIG. 17 are the sectional views showing the structure of the cutting plane of the width direction of an inner lead of the lead frame of the modification of Embodiment 2 of the present invention.

Although FIG. 14 is the same jointing condition as FIG. 13, it is the case of frame body 1a with which flattening of the wire connection surface 1k was performed by coining. With the structure shown in FIG. 14, while being able to improve the flatness of wire connection surface 1k of inner lead 1b, wire connection surface 1k can be enlarged and improvement in wire bonding property can be aimed at.

Figure 15:
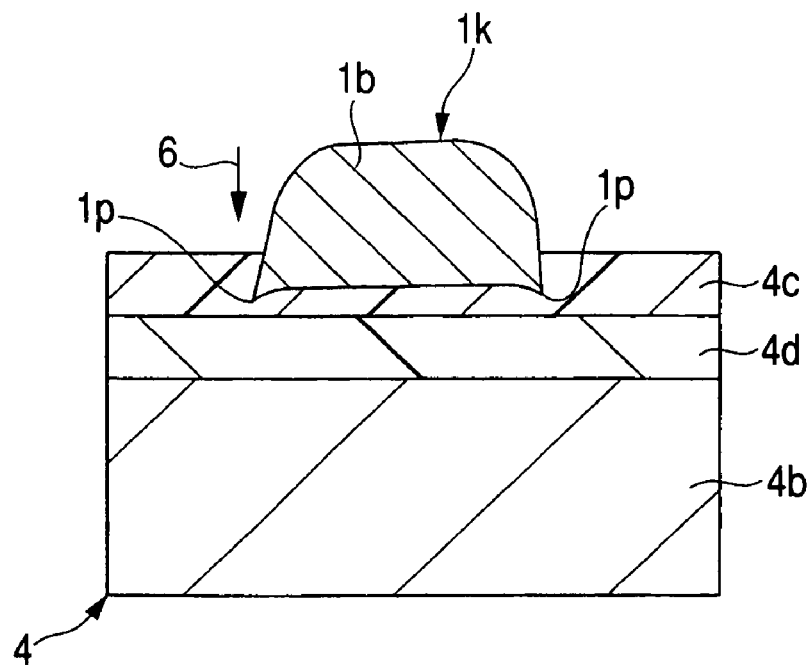

In FIG. 15, when patterning by press working, it punches from the surface at the side of chip mounting, and the surface at the side of burr portion 1p formation of inner lead 1b formed of this and sheet member 4 are joined. An adhesive layer includes first adhesive layer 4c of the insulation arranged at a surface side, and insulating second adhesive layer 4d harder than this first adhesive layer 4c in that case. When the surface at the side of burr portion 1p formation and sheet member 4 are joined, even if burr portion 1p breaks through surface first adhesive layer 4c, since second adhesive layer 4d is hard, it does not break through second adhesive layer 4d.

Therefore, it can prevent that burr portion 1p contacts copper plate 4b, and can prevent causing an electric short circuit.

In joining of frame body 1a and sheet member 4 (tape member 2) which were explained by Embodiment 1, since inner leads 1b are a large number, these inner leads 1b, bar leads 1d, and sheet members 4 must be joined surely, therefore the big press pressure at the time of joining must be applied.

That is, sheet member 4 and each inner lead 1b can be joined surely, securing insulation with copper plate 4b and each inner lead 1b by forming second adhesive layer 4d harder (a modulus of elasticity being high) than first adhesive layer 4c between first adhesive layer 4c and copper plate 4b, as shown in FIG. 15.

A hard binding material or the thick film material of second adhesive layer 4d is preferred.

With the structure shown in FIG. 15, the surface of the opposite side to the surface at the side of burr portion 1p formation may be joined to first adhesive layer 4c of sheet member 4, and performing coining of the surface at the side of burr portion 1p formation, this surface by which coining was performed, and first adhesive layer 4c of sheet member 4 may be joined.

Figure 16:
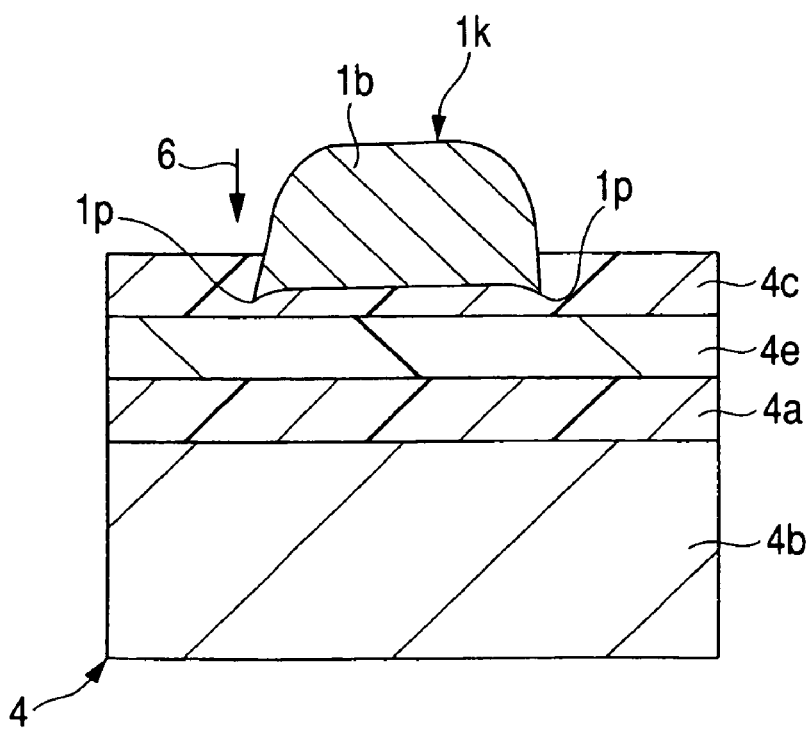

FIG. 16 shows the structure which joined the surface at the side of burr portion 1p formation of inner lead 1b to sheet member 4 which includes hard insulating film seat 4e and insulating first adhesive layer 4c, and breaking through of burr portion 1p of inner lead 1b can be stopped by film seat 4e.

Metal plates, such as copper plate 4b, are attached to the surface which is the opposite side to the first adhesive layer 4c side of film seat 4e via adhesive layer 4a. However, the metal plate does not need to be attached and there may not be adhesive layer 4a in that case, either.

Figure 17:
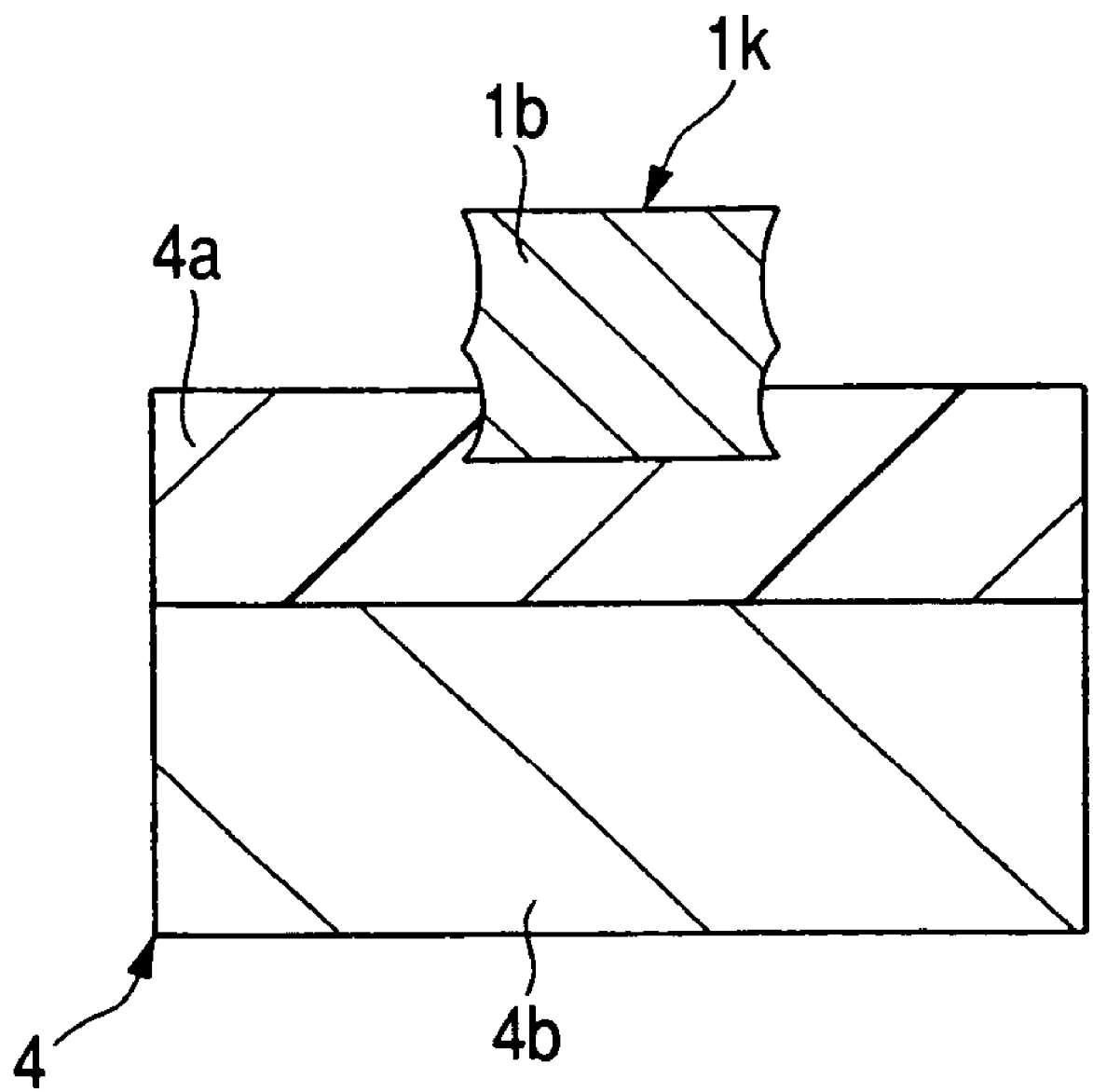

In FIG. 17, since patterning of frame body 1a is formed by etching processing, back-and-front both sides of inner lead 1b become a flat surface, without forming burr portion 1p as shown in FIG. 15.

In adopting the structure which joins this frame body 1a and sheet member 4, sheet member 4 should just include insulating adhesive layer 4a, and metal plates, such as copper plate 4b, the structure of sheet member 4 can be simplified, and insulation of the metal plate with each inner lead 1b and bar lead 1d can also be secured.

Moreover, it becomes easy to secure a wire bonding region.

As things mentioned above, the present inventions accomplished by the present inventors were concretely explained based on above embodiments, but the present inventions are not limited by above embodiments, but variations and modifications may be made, of course, in various ways in the limit that does not deviate from the gist.

In the Embodiment 1, although the case where the number of the ring of bar lead id was three or one row was explained, bar lead id of ring shape may be arranged at what row.

The semiconductor devices assembled using the lead frame shown in Embodiment 1 and 2 may be another semiconductor devices other than QFP.

INDUSTRIAL APPLICABILITY

As mentioned above, the lead frame of the present invention and its manufacturing method are suitable for the lead frame which has a bar lead (common lead), and suitable for the lead frame whose outer lead extends and exists in the four directions especially, and its manufacturing method.

The invention claimed is:

1. A manufacturing method of a lead frame having a plurality of inner leads, a plurality of outer leads formed in one with this, and a sheet member joined to a tip part of each inner lead, comprising the steps of:
    (a) preparing a frame body in which tip parts of the inner leads are mutually formed in one by a first connection part;
    (b) preparing the sheet member which is formed in a shape corresponding to a plurality of inner lead rows, and includes a metal plate, an insulating first adhesive layer arranged at a surface side, and an insulating second adhesive layer harder than this first adhesive layer;
    (c) sticking a tip part of each of the inner leads and the first connection part, and the sheet member; and
    (d) after the step (c), removing the first connection part from the frame body by punching and cutting the first connection part using a punch along tip parts of the inner leads;
    wherein in the step (c), the inner lead and the sheet member are stuck making a surface at a side of burr formation of the inner lead contact to at least the first adhesive layer of the sheet member.

2. A manufacturing method of a lead frame having a plurality of inner leads, a plurality of outer leads formed in one with this, and a sheet member joined to a tip part of each inner lead, comprising the steps of:
    (a) preparing a frame body in which tip parts of the inner leads are mutually formed in one by a first connection part, and flattening of a wire connection surface of each inner lead is further performed by coining;
    (b) preparing the sheet member which is formed in a shape corresponding to a plurality of inner lead rows, and includes a metal plate and an insulating adhesive layer;
    (c) sticking a tip part of each of the inner leads and the first connection part, and the sheet member; and
    (d) after the step (c), removing the first connection part from the frame body by punching and cutting the first connection part using a punch along tip parts of the inner leads;
    wherein the adhesive layer of the sheet member includes a first adhesive layer arranged at a surface side, and a second adhesive layer harder than this first adhesive layer, and in the step (c), the inner lead and the sheet member are stuck making a surface of an opposite side of a wire connection surface of the inner lead contact to at least the first adhesive layer of the sheet member.

* * * * *